US006605834B1

(12) United States Patent
Lee

(10) Patent No.: US 6,605,834 B1
(45) Date of Patent: Aug. 12, 2003

(54) DIELECTRIC FOR PLASMA DISPLAY PANEL AND COMPOSITION THEREOF

(75) Inventor: Yoon Kwan Lee, Kwangmyung (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/498,989

(22) Filed: Feb. 7, 2000

(30) Foreign Application Priority Data

Feb. 8, 1999 (KR) .......................................... P99-4190
Oct. 7, 1999 (KR) .......................................... P99-43283

(51) Int. Cl.[7] ................................................ H01L 29/76
(52) U.S. Cl. ........................... 257/295; 257/80; 257/82; 257/88; 257/89; 257/93; 257/103
(58) Field of Search ...................................... 257/80, 98

(56) References Cited

U.S. PATENT DOCUMENTS 5,756,147 A * 5/1998 Wu et al. ..................... 427/66
6,043,604 A * 3/2000 Horiuchi et al. ............ 313/582
6,160,345 A * 12/2000 Tanaka et al. .............. 313/489
6,215,246 B1 * 4/2001 Kim et al. .................. 313/584

FOREIGN PATENT DOCUMENTS

JP 55-051732 A * 4/1980 ............. C03C/3/30
JP 11-067099 A * 3/1999 ........... H01L/11/02

* cited by examiner

*Primary Examiner*—Long Pham
*Assistant Examiner*—Wai-Sing Louie
(74) *Attorney, Agent, or Firm*—Fleshner & Kim, LLP

(57) ABSTRACT

An upper dielectric layer in a plasma display panel that is capable of enlarging an insulation intensity as well as improving a dielectric constant. In the upper dielectric layer, a ferrodielectric thin film and a dielectric thick film are provided. Since the upper dielectric layer uses a ferrodielectric thin film with a high temperature stability made by a vacuum vapor deposition technique, it can minimize a chemical reaction to electrodes and a generation of bubble to keep a stable discharge characteristic. Also, it can enlarge a capacitance value to reduce a discharge voltage.

26 Claims, 6 Drawing Sheets

DIELECTRIC FOR PLASMA DISPLAY PANEL AND COMPOSITION THEREOF

BACKGROUND OF THE INVENTION

1. Field of the Invention

This invention relates to a plasma display panel (PDP), and more particularly to a dielectric for an upper plate suitable for the PDP and a method of fabricating the same. The present invention also is directed to a dielectric for a lower plate in the PDP and a dielectric composition adaptive for forming a barrier rib in the PDP.

2. Description of the Related Art

Generally, a plasma display panel (PDP) radiates a fluorescent body by an ultraviolet with a wavelength of 147 nm generated during a discharge of He+Xe or Ne+Xe gas to thereby display a picture including characters and graphics. Such a PDP is easy to be made into a thin film and large-dimension type. Moreover, the PDP provides a very improved picture quality owing to a recent technical development. The PDP is largely classified into a direct current (DC) driving system and an alternating current (AC) driving system.

The PDP of AC driving system is expected to be highlighted 30 into a future display device because it has advantages in the low voltage drive and a prolonged life in comparison to the PDP of DC driving system. Also, the PDP of AC driving system allows an alternating voltage signal to be therebetween to generate a discharge every half-period of the signal, thereby displaying a picture. Since such an AC-type PDP uses a dielectric material, the surface of the dielectric material is charged with electricity. The AC-type PDP allows a memory effect to be produced by a wall charge accumulated to the dielectric material due to the discharge.

FIG. 1 is a sectional view showing the structure of a discharge cell in the conventional three-electrode AC-type PDP, in which a lower plate is illustrated in a state of rotating an angle of 90°. In FIG. 1, the discharge cell includes an upper plate 10 provided with a sustaining electrode pair 12 and 14, and a lower substrate 20 provided with an address electrode 20. The upper substrate 10 and the lower substrate 20 are spaced, in parallel, from each other with having a barrier rib 28 therebetween.

A mixture gas such as Ne—Xe or He—Xe, etc. is injected into a discharge space defined by the upper substrate 10 and the lower substrate 20 and the barrier rib 28. The sustaining electrode pair 12 and 14 consists of transparent electrodes 12A and 14A and metal electrodes 12B and 14B. The transparent electrodes 12A and 14A are usually made from Indium-Tin-Oxide (ITO) and has an electrode width of about 300 μm. Usually, the metal electrodes 12B and 14B take a three-layer structure of Cr—Cu—Cr and have an electrode width of about 50 to 100 μm. These metal electrodes 12A and 14A play a role to decrease a resistance of the transparent electrodes 12A and 14A6 with a high resistance value to thereby reduce a voltage drop. Any one 12 of the sustaining electrode pair 12 and 14 is used as a scanning/sustaining electrode that responds to a scanning pulse applied in an address interval to cause an opposite discharge along with the address electrode 22 while responding to a sustaining pulse applied in a sustaining interval to cause a surface discharge with the adjacent sustaining electrodes 14. A sustaining electrode 14 adjacent to the sustaining electrode 12 used as the scanning/sustaining electrode is used as a common sustaining electrode to which a sustaining pulse is applied commonly. A distance between the sustaining electrode pair 12 and 14 is set to be approximately 100 μm. On the upper substrate 10 provided with the sustaining electrode pair 12 and 14, an upper dielectric layer 16 and a protective layer 18 are disposed. The dielectric layer 16 is responsible for limiting a plasma discharge current as well as accumulating a wall charge during the discharge. The protective film 18 prevents a damage of the dielectric layer 16 caused by a sputtering generated during the plasma discharge and improves an emission efficiency of secondary electrons. This protective film 18 is usually made from MgO. The address electrode 22 is crossed with the sustaining electrode pair 12 and 14 and is supplied with a data signal for selecting cells to be displayed. On the lower substrate 20 formed with the address electrode 24, a lower dielectric layer 24 is provided. Barrier ribs 28 for dividing the discharge space are extended perpendicularly on the lower dielectric layer 24. On the surfaces of the lower dielectric layer 24 and the barrier ribs 28 is coated a fluorescent material 26 excited by a vacuum ultraviolet lay to generate a red, green, or blue visible light.

In such a PDP, the upper dielectric layer 16 has a transmissivity of about 85% at the central wavelength to transmit a visible light. The upper dielectric layer 16 also accumulates a wall charge to thereby sustain the discharge by a discharge sustaining voltage. In this case, since a larger capacitance value is required to lower a discharge voltage, the upper dielectric layer 16 has a relatively high dielectric constant of about 10 to 15. The upper dielectric layer 16 plays a role to protect the sustaining electrodes 12 and 14 from an ion impact during the plasma discharge and serves as an anti-diffusion film. The upper dielectric layer 16 consists of first and second upper dielectric layers 16A and 16B that are usually made from a glass having a different softening point. As the first upper dielectric layer 16A contacted directly with the sustaining electrodes 12 and 14 is used a glass with a relatively higher softening point so as to avoid a chemical reaction between the transparent electrodes 12A and 14A and the metal electrodes 12B and 14B. The second upper dielectric layer 16B formed on the first upper dielectric layer 16A requires a high smoothing coefficient so as to provide the protective film 18. For this reason, as the second upper dielectric layer 16B is used a low softening glass having a softening point tens of degrees lower than the first upper dielectric layer 16A.

FIG. 2 shows a process of forming the upper dielectric layer 16. At step S2, a first glass paste with a relatively high softening point is printed on the upper substrate 10 provided with the sustaining electrodes 12 and 14 using the screen printing technique. In this case, the glass paste is prepared by mixing borosilicate glass powder having a particle diameter of 1 to 2 μm and containing Pb of about more than 40% with an organic binder. At step S4, the printed first glass paste is fired at a temperature of 550 to 580° C. to form the first upper dielectric layer 16A. Then, at steps S6 and S8, a second glass paste with a relatively low softening point is printed on the first upper dielectric layer 14A using the screen printing technique and thereafter is fired at a temperature of 550 to 580° C., thereby forming the second upper dielectric layer 16B.

As described above, the upper dielectric layer 16 is provided by firing a paste, which is a mixture mixed with an organic binder, at a temperature of less than 600° C. so as to prevent a thermal deformation of the upper substrate 10. Due to this, since the conventional upper dielectric layer 16 fails to become a complete plastic material, a bubble caused by a residual organic material exists in the interior thereof. The bubble existing in the interior of the dielectric layer brings about an insulation destruction to have a serious influence on a characteristic and a life of the device. A bubble generating at a contact portion between the upper dielectric layer 16 and the sustaining electrodes 12 and 14 causes a problem in that it drops a dielectric constant to increase a discharge voltage. Furthermore, the conventional upper dielectric layer 16 has a problem in that a glass component resulting from a diffusion caused by a thermochemical reaction at a portion contacting the sustaining electrodes 12 and 14 upon firing is penetrated into the sustaining electrodes 12 and 14 to raise a resistance value of the sustaining electrodes 12 and 14 and thus increase a discharge voltage.

The lower dielectric layer 24 prevents atom diffusion from the address electrode 22 into the fluorescent material 26. The lower dielectric layer 24 must reflect a visible light back-scattered and coming out from the fluorescent material 26 to prevent a brightness deterioration of the PDP caused by a back light. The barrier rib 28 also must reflect a visible light back-scattered and coming out from the fluorescent material 26 like the lower dielectric layer 24 to prevent an optical interference between discharge cells as well as to prevent a brightness deterioration caused by a back light. Accordingly, the lower dielectric layer 24 and the barrier rib 28 require a dense organization to have a high reflectivity. To this end, as the lower dielectric layer 24 and the barrier rib 28 is used a glass-ceramics material mixing the same series of parent glass with an oxide filler for increasing the reflectivity.

In other words, most materials for the barrier rib 28 and the lower dielectric layer 24 uses a glass-ceramics material in which borosilicate glass powder containing Pb of about more than 40% is mixed with an oxide filler consisting of 10 to 30 weight % $TiO_2$ powder or 10 to 30 weight % $Al_2O_3$ powder with a particle size of 1 to 1 $\mu$m. In this case, the relationship of a composition of an oxide filler for the lower dielectric layer 24 and the barrier rib 28 to characteristics of the lower dielectric layer 24 and the barrier rib 28 and thus to a characteristic of the PDP is indicated in the following tables:

TABLE 1

| | Composition | content (wt %) |
|---|---|---|
| Parent Glass | PbO based Borosilicate glass | 70~90 |
| Filler | at least one of $TiO_2$ and $Al_2O_2$ | 10~30 |

TABLE 2

| Parent Glass | Filler | Dielectric Constant (k-at 1 MHz) | Thermal Expansive Coefficient ($\times 10^{-7}$/° C.) | Reflec-tivity (%) |
|---|---|---|---|---|
| PbO based Borosilicate Glass | $TiO_2$ $Al_2O_3$ | 13 | 85.5 | 53 |

TABLE 3

| Brightness (Cd/m$^2$) | Back Light (Cd/m$^2$) | Ratio of Back Light (%) |
|---|---|---|
| 80~90 | 4~5 | 4~6 |

It can be seen from Table 1 and Table 2 that, when 10 to 30 weight % $TiO_2$ or 10 to 30 weight % $Al_2O_3$ is used as an oxide filler, the barrier rib 28 and the lower dielectric layer 24. Accordingly, as indicated in Table 3, this causes a problem in that, since a large amount of back light transmits the barrier rib 28 and the lower dielectric layer 24, the brightness of PDP device becomes low. In order to solve this problem, the lower dielectric layer 24 and the barrier rib 28 require a reflection characteristic of more than 50% at the central wavelength, a low dielectric constant of less than 10 and a dense organization. Also, the lower dielectric layer 24 and the barrier rib 28 require a low thermal expansive coefficient for preventing a crack, a thermal stability and a low firing temperature for preventing a crack in the lower substrate 20 upon firing.

SUMMARY OF THE INVENTION

Accordingly, it is an object of the present invention to provide an upper dielectric layer in a PDP and a fabrication method thereof that is capable of preventing an insulation breakdown and a crack caused by a bubble generation resulting from an incomplete firing and a residual organic material from the upper dielectric layer by using a ferrodielectric thin film.

A further object of the present invention is to provide an upper dielectric layer in a PDP that is capable of reducing a discharge voltage by using a ferrodielectric thin film.

A yet further object of the present invention is to provide an upper dielectric layer in a PDP and a fabrication method thereof that is capable of preventing a thermochemical reaction to electrodes upon firing of the upper dielectric layer.

A still further object of the present invention is to provide dielectric compositions for a lower dielectric layer and a barrier rib in a PDP that is capable of increasing the reflectivity of the upper dielectric layer and the barrier to improve the brightness.

A still further object of the present invention is to provide dielectric compositions for a lower dielectric layer and a barrier rib in a PDP that is capable of decreasing the dielectric constant of the lower dielectric layer and the barrier rib to improve a response speed of the PDP.

A still further object of the present invention is to provide dielectric compositions for a lower dielectric layer and a barrier rib in a PDP that is capable of increasing a degree of crystallization of a dielectric material to prevent an atom diffusion from an address electrode into a fluorescent material.

In order to achieve these and other objects of the invention, an upper dielectric layer in a plasma display panel according to one aspect of the present invention includes a ferrodielectric thin film formed on an upper substrate provided with a certain electrodes; and a dielectric thick film formed on the ferrodielectric thin film. Also, the upper dielectric layer further includes a ferrodielectric thin film formed on the dielectric thick film.

A process of fabricating an upper dielectric layer in a plasma display panel according to another aspect of the present invention includes the steps of forming a ferrodielectric thin film on an upper substrate provided with a certain electrodes using a vacuum vapor deposition technique; and forming a dielectric thick film on the ferrodielectric thin film using a screen printing technique. Also, the process further includes forming a ferrodielectric thin film on the dielectric thick film using the vacuum vapor deposition technique.

A dielectric composition for a lower dielectric layer and a barrier rib in a plasma display panel according to still another aspect of the present invention includes a parent glass; and an oxide filler containing a phosphorus (P) element. Also, the dielectric composition further includes another oxide filler made from $TiO_2$.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENT

Figure 3:
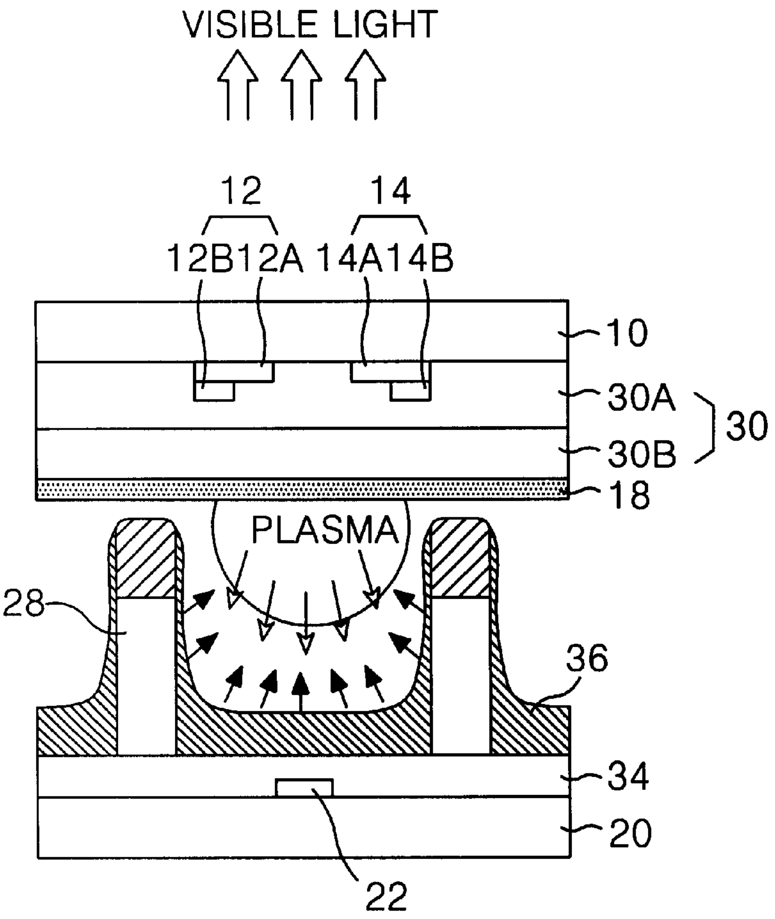
FIG. 3 is a sectional view showing the structure of a discharge cell in a plasma display panel according to an embodiment of the present invention.

Referring to FIG. 3, there is shown a plasma display panel (PDP) according to an embodiment of the present invention. The PDP includes a ferrodielectric thin film 30A formed on an upper substrate 10 provided with sustaining electrodes 12 and 14, an upper dielectric layer 30 made from a dielectric thick film 30B provided on the ferrodielectric thin film 30A, and a protective film 18 coated on the upper dielectric layer 30. The ferrodielectric thin film 30A in the upper dielectric layer 30 is provided by coating a transparent ferrodielectric material having a high dielectric constant using the vacuum vapor deposition instead of the conventional screen printing technique. Accordingly, a problem such as an incomplete firing and a residual organic material upon formation of the ferrodielectric thin film 30A is eliminated, so that an insulation breakdown and a crack caused by a bubble generation can be prevented. Types of ferrodielectric materials used for the ferrodielectric thin film 30A and characteristic according to each type are as follows:

TABLE 4

| Ferrodielectric | Transmissivity | Dielectric Constant |
|---|---|---|
| (Pa, La)—(ZrTi)$O_3$ | 75~85 | 1600 |
| (Pa, Bi)—(ZrTi)$O_3$ | Transparent | 2300 |
| (Pa, La)—(HfTi)$O_3$ | 75~84 | 1300 |
| (Pa, Ba)—(ZrTi)$O_3$ | 75~80 | 2300 |
| (Pa, Sr)—(ZrTi)$O_3$ | 80~85 | 1700 |
| (Sr, Ca)—(LiNbTi)$O_3$ | 83~87 | 3200 |
| $LiTaO_3$ | 75~83 | 1200 |
| $SrTiO_3$ | 70~80 | 1500 |
| $La_2Ti_2O_7$ | 75~83 | 2600 |
| $LiNbO_3$ | 74~84 | 1000 |
| (Pa, La)—(MgNbZrTi)$O_3$ | Transparent | 2500 |
| (Pa, Ba)—(LaNb)$O_3$ | Transparent | 1700 |
| (Sr, Ba)—$Mb_2O_3$ | 75~85 | 2400 |

TABLE 4-continued

| Ferrodielectric | Transmissivity | Dielectric Constant |
|---|---|---|
| K(Ta, Nb)$O_3$ | 76~87 | 2200 |
| (Sr, Ba, La)—($Nb_2O_6$) | 80~86 | 1900 |
| $NaTiO_3$ | 76~85 | 1000 |
| $MgTiO_3$ | 70~84 | 1100 |
| $BaTiO_3$ | 73~84 | 1500 |
| $SrZrO_3$ | 76~83 | 1700 |
| $KNbO_3$ | 75~80 | 1100 |

As seen from Table 4, most ferrodielectric materials have the transmissivity of more than 80% and the dielectric constant of more than 1000. Accordingly, the upper dielectric layer 30 including said ferrodielectric material has a high capacitance value to accumulate a lot of electric charge on the surface of the protective film, thereby reducing a discharge voltage. Also, said ferrodielectric materials can minimize a generation of bubble caused by a reaction to the sustaining electrodes 12 and 14 because they are a material stable at a high temperature, so that they can prevent a rise of discharge voltage caused by a generation of bubble at a portion contacted with the electrodes 12 and 14. Furthermore, since said ferrodielectric materials have an insulation breakdown strength of about $10^6$ /m, so that the PDP can sustain a stable discharge characteristic.

Figure 1:
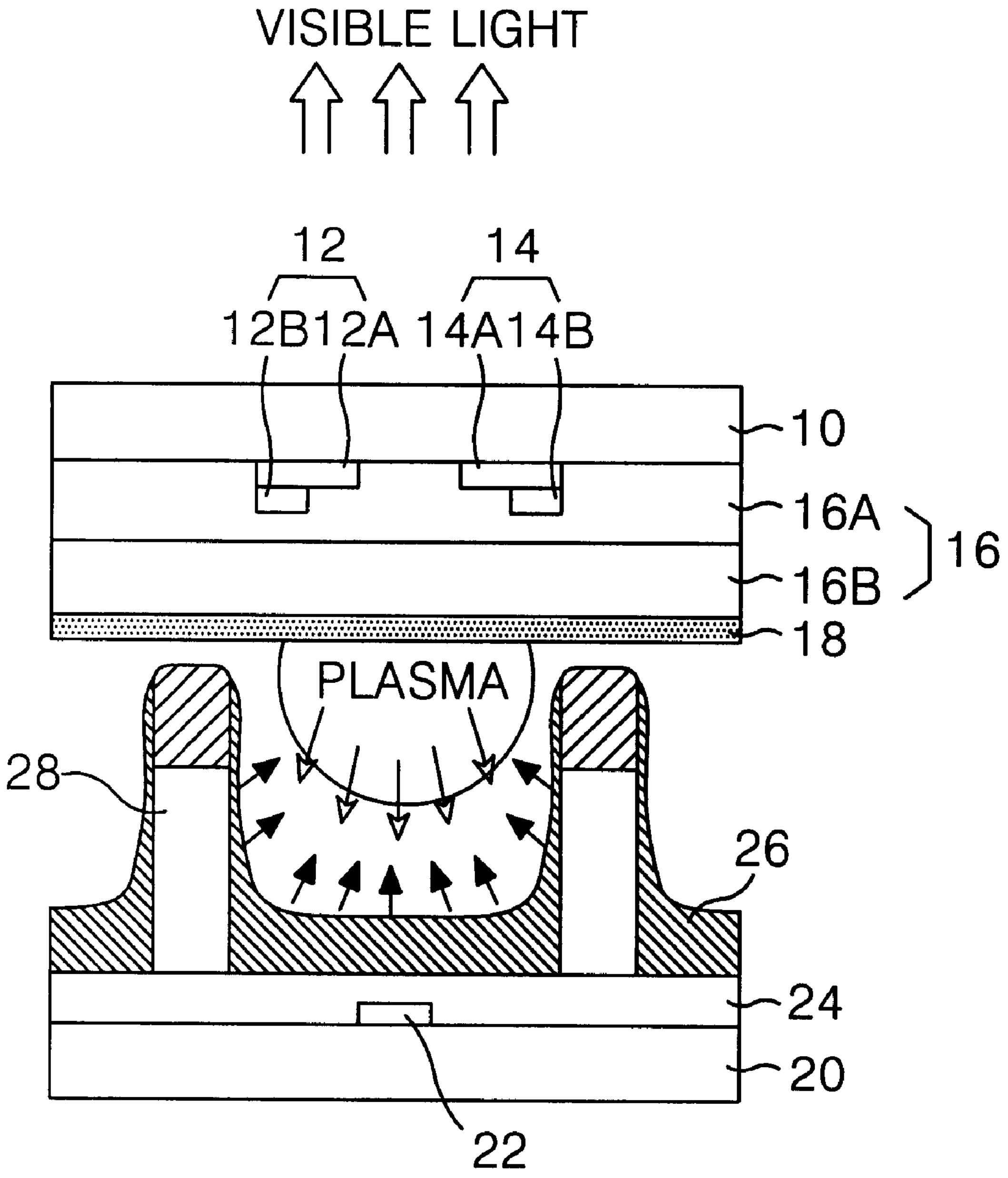
FIG.1 RELATED ART
FIG. 1 is a sectional view showing the structure of a discharge cell in a conventional three-electrode, AC-type plasma display panel.
Figure 2:
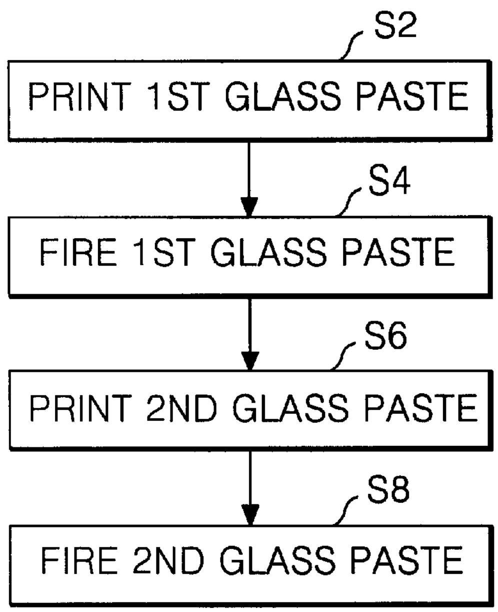
FIG.2 RELATED ART
FIG. 2 is a flow chart for explaining a procedure of forming the conventional upper dielectric layer.
Figure 4:
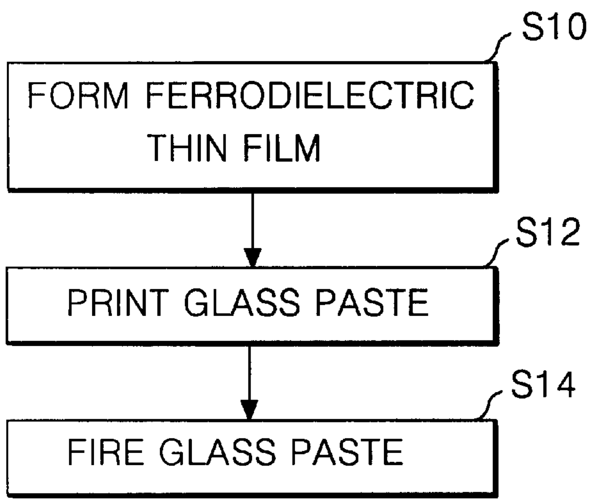
FIG. 4 is a flow chart for explaining a process of fabricating the upper dielectric layer in FIG. 3.

A process of fabricating the upper dielectric layer 30 including the ferrodielectric thin film 30A having the above-mentioned characteristic will be described with reference to FIG. 4. At step S10, the ferrodielectric thin film 30A is formed on the upper substrate 10 provided with the sustaining electrodes 12 and 14. The ferrodielectric thin film 30A is provided by coating a ferrodielectric material as indicated in Table 4 into a thickness of several μm using the vacuum vapor deposition technique. The sputtering method or the ion plating method is mainly used as the vacuum vapor deposition. In this case, a mixture in which several % of oxygen gas is mixed with an inactive gas is used so as to maintain a chemical quantity ratio of the ferrodielectric thin film 30A. After forming the ferrodielectric thin film 30A, a dielectric thick film 30B is formed on the ferrodielectric thin film 30A by the same screen printing method as the prior art at steps S12 and S14. The dielectric thick film 30B is provided by coating a paste mixing a glass with a low melting point with an organic binder by the screen printing technique and thereafter firing it at a firing temperature. Finally, a MgO protective film 10 is provided on the dielectric thick film 30B after forming the dielectric thick film 30B.

Figure 5:
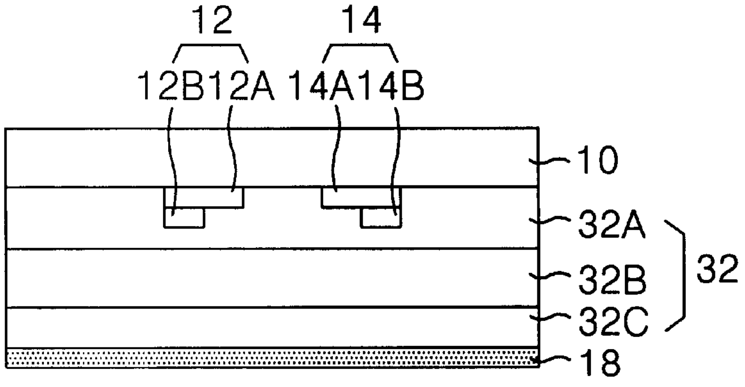
FIG. 5 is a sectional view showing the structure of an upper substrate in a plasma display panel including an upper dielectric layer according to another embodiment of the present invention.

Referring now to FIG. 5, there is shown an upper substrate in a PDP including an upper dielectric layer according to another embodiment of the present invention. The upper dielectric layer 32 consists of first and second ferrodielectric thin films 32A and 32C, and a dielectric thick film 32B provided between the first and second ferrodielectric thin films 32A and 32C. in this case, the upper dielectric layer 32 has a higher capacitance value by the first and second ferrodielectric thin films 32A and 32C to accumulate more electric charges on the surface of the protective film, thereby more lowering a discharge voltage. As the second ferrodielectric thin film 32C with a relatively high elastic coefficient is introduced between the protective film 18 and the dielectric thick film 32B, a propagation of a crack from the protective film 18 can be effectively prevented. In addition, alkali ions and Pb atoms, etc. from a low melting point glass used for the dielectric thick film 32B shut off a diffusion into the protective film 18 to prevent a contamination of the protective film 18, so that the protective film 18 can maintain a stable secondary electron emission characteristic.

Figure 6:
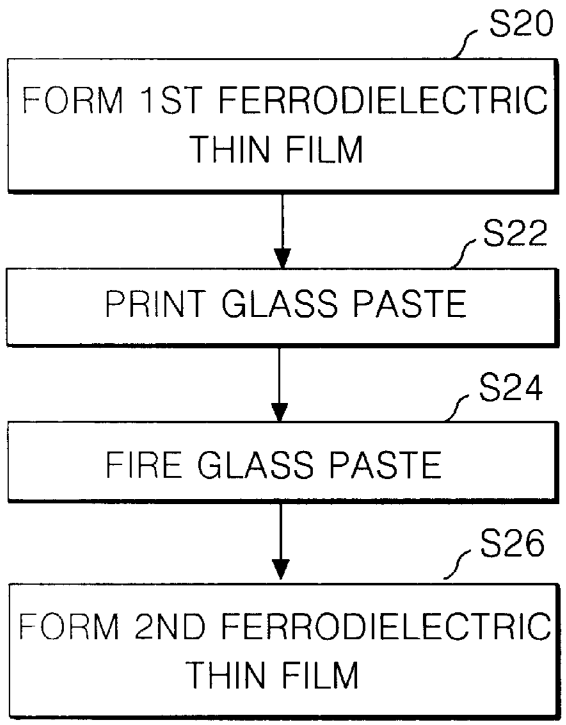
FIG. 6 is a flow chart for explaining a process of fabricating the upper dielectric layer in FIG. 5.

FIG. 6 explains a method of fabricating the upper dielectric layer 32 shown in FIG. 5 step by step. In FIG. 6, the first ferrodielectric thin film 32A and the dielectric thick film 32B are provided in similarity to FIG. 3 at steps S20 to S24. After forming the dielectric thick film 32B, the second dielectric thin film 32C is provided by the vacuum vapor deposition at step S26. Finally, a MgO protective film 18 is provided on the second ferrodielectric thin film 32C after forming the second ferrodielectric thin film 32C.

Returning to FIG. 3, the PDP according to an embodiment of the present invention includes a lower dielectric layer 34 provided on the lower substrate 20 including the address electrode 22, a barrier rib 36 provided on the lower dielectric layer 34, and a fluorescent material 26 formed on the surfaces of the lower dielectric layer 34 and the barrier rib 36. In FIG. 3, the lower dielectric layer 34 and the barrier rib 36 includes an oxide filler containing a P element unlike the prior art. In other words, a dielectric composition used for the barrier rib 36 and the lower dielectric layer 34 includes a parent glass and a first oxide filler, and a second oxide filler containing a P element. The composition and the component ratio of such a dielectric material are as follows:

TABLE 5

| | Composition | Content (wt %) |
|---|---|---|
| Parent Glass | PbO or non-PbO Based Glass | 50~80 |
| First Filler | $TiO_2$ | 5~30 |
| Second Filler | At least one of $BPO_4$, ZnO, $Li_3PO_4$ | 5~20 |

As seen from Table 5, a dielectric composition for the lower dielectric layer 34 and the barrier rib 36 includes PbO or non-PbO group parent glass powder of 50 to 80 weight %, a first filler of 5 to 30 weight %, a second filler of 5 to 20 weight %. Herein, the second oxide filler containing at least one of $BPO_4$, ZnO, $Li_3PO_4$ restrains a rise of electric constant caused by the first oxide filler (i.e., $TiO_2$) to keep electric constants of the lower dielectric layer 34 and the barrier rib 36 at less than 10 in the case of 30 weight % $TiO_2$ as indicated in the following table:

TABLE 6

| Parent Glass | Filler | Dielectric Constant (k-at 1 MHz) | Thermal Expansive Coefficient ($\times 10^{-7}$/° C.) | Reflectivity (%) |
|---|---|---|---|---|
| $SiO_2$—ZnO Based Glass | $TiO_2$ (20 wt %) $BPO_4$ (10 wt %) | 8.24 | 84.8 | 73 |

The second oxide filler allows crystals with a size of tens of $\mu$m to be precipitated into the dielectric material upon firing to have a dense dielectric organization, thereby effectively preventing an enlargement in the reflectivity and a diffusion of the address electrode material. Particularly, when parent glass powder of PbO or non-PbO group containing ZnO is used and an oxide containing a P element like $BPO_4$ or $Li_3PO_4$ as indicated in Table 6 is used as the second filler, more reliable effect can be obtained. This results in a $P^{+5}$ ion having a high ion field strength of 43 (wherein Z represents an atomic value, and r does an ion radius) generating an asymmetrical and unstable binding state caused by a local charge difference at the parent glass upon sintering at a high temperature to provide a condition that ZnO turns into a glass. As a result, a phenomenon of easily precipitating ZnO as shown in FIG. 7 is generated.

Figure 7:
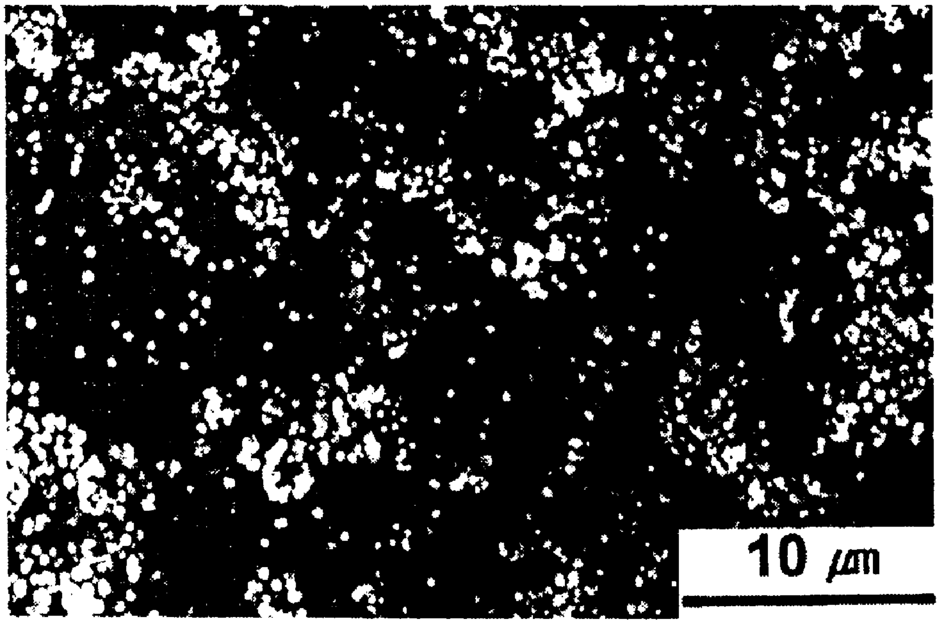
FIG. 7 shows a SEM organization photograph for a lower dielectric layer to which a dielectric composition according to an embodiment of the present invention is applied.

FIG. 7 shows a SEM (scanning electron microscope) organization photograph of the lower dielectric layer 34 to which a dielectric composition according to an embodiment of the present invention is applied. It can be seen from FIG. 7 that, when the lower dielectric layer 34 includes 30 weight % $TiO_2$ as the first filler and 30 weight % $BPO_4$ as the second filler, ZnO is easily precipitated upon firing. As ZnO is easily precipitated, the lower dielectric layer 34 becomes dense and a crystallization and a firing temperature is deteriorated. Also, since $TiO_2$ and ZnO having a high refraction index of more than 2.0 coexist within the lower dielectric layer 34, the reflectivity at a central wavelength of 550 nm is increased.

Figure 8:
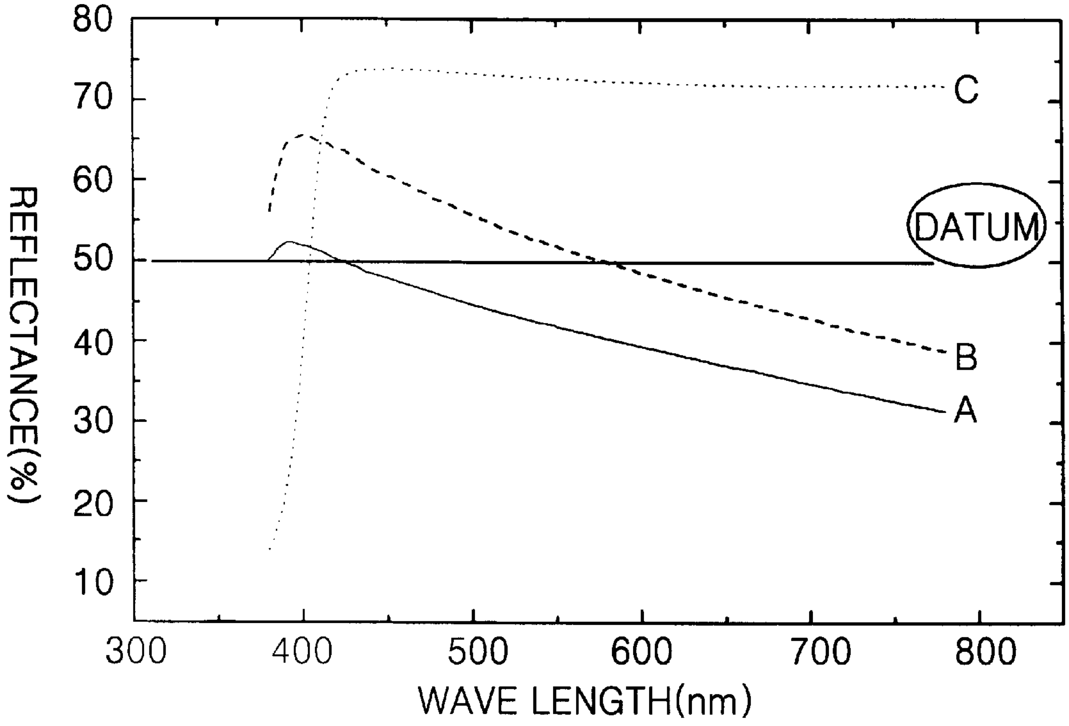
FIG. 8 is a graph representing reflectivity curves of a lower dielectric layer to which the conventional dielectric composition is applied and a lower dielectric layer to which a dielectric composition according to an embodiment of the present invention is applied.

FIG. 8 is a graph for comparing a reflectivity curve of the lower dielectric layer 24 to which the conventional dielectric composition with that of the lower dielectric layer 34 to which the dielectric composition according to an embodiment of the present invention. In FIG. 8, A curve represents a reflectivity of a dielectric material including only the first filler (i.e., 20 weight % $TiO_2$) in the composition as indicated in Table 5; B curve represents a reflectivity of the lower dielectric layer 24 including the conventional composition; and C curve represents a reflectivity of the lower dielectric layer 34 including the first filler (i.e., 20 weight % $TiO_2$) and the second filler (i.e., 10 weight % $BPO_4$) according to an embodiment of the present invention. As seen from these reflectivity curves, the lower dielectric layer 24 made from the conventional dielectric composition has a reflectivity of 53% at the central wavelength of 550 nm while the lower dielectric layer 34 made from a composition according to an embodiment of the present invention has a reflectivity of 73%, which is increased dramatically in comparison to the reflectivity of the lower dielectric layer 24.

Figure 9:
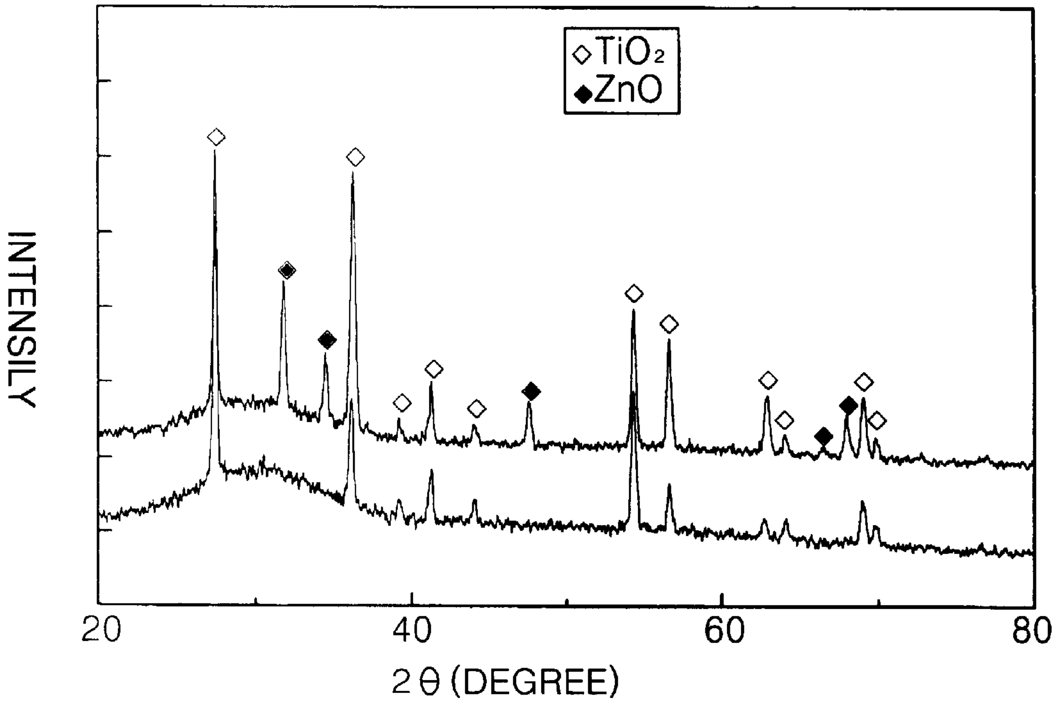
FIG. 9 is a graph representing an organization crystallization of a lower dielectric layer to which the conventional dielectric composition is applied and a lower dielectric layer to which a dielectric composition according to an embodiment of the present invention is applied.

FIG. 9 is a graph for comparing an organization crystallization, that is, an organization intensity of the lower dielectric layer 24 to which the conventional dielectric composition is applied with that of the lower dielectric layer 34 to which the dielectric composition according to an embodiment of the present invention is applied. It can be seen from FIG. 9 that an intensity (B) of the lower dielectric layer 34 including the first filler (i.e., 20 weight % $TiO_2$) and the second filler (i.e., 10 weight % $BPO_4$) according to an embodiment of the present invention is larger than an intensity (A) of the conventional lower dielectric layer 24 including 20 weight % $TiO_2$ as an oxide filler. Particularly, it can be seen that ZnO has been precipitated at the B sample.

A discharge characteristic of a 7.5 inch PDP device to which the lower dielectric layer 34 including the dielectric composition according to an embodiment of the present invention is applied is as follows:

TABLE 7

| Brightness ($Cd/m^2$) | Back Light ($Cd/m^2$) | Ratio of Back Light (%) |
|---|---|---|
| 100~110 | 1~2 | 1~2 |

It can be seen from Table 7 that the brightness of the PDP device to which a dielectric composition according to an embodiment of the present invention is applied is increased by about 20% to 30% in comparison to the prior art in Table 3, and particularly a back light transmitted into a rear surface of the PDP is dramatically reduced into about two times to five times of the prior art.

Figure 10:
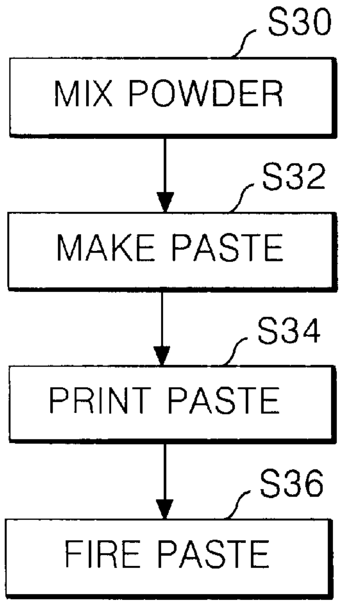
FIG. 10 is a flow chart for explaining a process of fabricating a lower dielectric layer to which a glass composition according to an embodiment of the present invention.

FIG. 10 shows a process of fabricating a lower dielectric layer to which the dielectric composition according to an embodiment of the present invention is applied. At step S30, a mixture powder is prepared by mingling PbO or non-PbO glass powder with a grain size of about 5 $\mu$m with the first and second fillers with a grain size of about 3 $\mu$m in accordance with a certain mixing ratio and thereafter mixing it for 7 hours using the tumbling mixer. Next, at step S32, the mixture powder is blended with an organic vehicle to make a paste state. In this case, when the mixing ratio of the organic vehicle is 20% BCA (butyl-carbitol-acetate), 20% BC (butyl-carbitol) and 10% EC (ethyl-cellulose), a viscosity of the paste becomes about 100,000 cps to make an optimum coated state upon screen-printing at the next step. At step S34, said paste is coated into a thickness of 10 to 15 $\mu$m on the lower substrate 20 at two pass by means of the screen printing technique using the #259 Sus screen. Consequently, at step S36, the lower dielectric layer 34 is completed by drying the paste coated on the upper substrate at about 150° C. during a desired hours within the dry oven and thereafter introducing the lower substrate 20 into a batch or in-line type resistance heating furnace of resistance heating system to fire it at the oxidation atmosphere.

Meanwhile, the barrier rib 36 to which the dielectric composition according to an embodiment of the present invention is provided by using the screen printing method, the sand blast method, the additive method and the like.

The lower dielectric layer 34 and the barrier rib 36 provided in the above manner reflect a visible light backscattered from the fluorescent material 26 to increase the brightness of the device. Also, the lower dielectric layer 34 restrains atom diffusion from the address electrode 22 to protect the fluorescent material 26.

As described above, since the upper dielectric layer in the PDP and the fabrication method thereof according to the present invention uses a thin film with a high temperature stability and a ferrodielectric characteristic formed by the vacuum vapor deposition, it is capable of minimizing a chemical reaction to the electrodes and a generation of bubble. Accordingly, an insulation intensity of the upper dielectric layer is enlarged, so that the PDP can keep a stable discharge characteristic. Also, the upper dielectric layer of the PDP according to the present invention according to the present invention uses a ferrodielectric thin film with a high dielectric constant, so that it can enlarge a capacitance value to reduce a discharge voltage. In addition, it uses a ferrodielectric thin film with a relatively high elastic coefficient, it can minimize a generation of progressive crack from the protective film.

Furthermore, since the upper dielectric layer in the PDP and the fabrication method thereof according to the present invention uses a mixture including $TiO_2$ as the first filler and at least one of oxides (e.g., $BPO_4$, $Li_3PO_4$) containing a P element and ZnO oxide as the second filler, it can increase the reflectivity to improve the brightness of PPD device. Also, the dielectric composition for the lower dielectric layer and the barrier rib in the PDP according to the present invention keeps a low dielectric constant by the second filler in spite of an increase of the first filler (i.e., $TiO_2$) having a significant influence on an increase in the reflectivity, so that it can improve a response speed of the PDP. Moreover, it allows the P element of the second filler to increase the crystallization of the lower dielectric layer upon heat treatment to maintain a state of thick film, it can restrain atom diffusion from the address electrode to effectively prevent a deterioration of the fluorescent material.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. An upper dielectric layer in a plasma display panel, comprising:

a first ferrodielectric thin film formed on an upper substrate provided with an electrode pair; and a dielectric thick film formed on the first ferrodielectric thin film.

2. The upper dielectric layer according to claim 1, wherein said first ferrodielectric thin film is made from a ferrodielectric material having a visible light transmissivity of about more than 80% and a dielectric constant of more than 1000.

3. The upper dielectric layer according to claim 1, wherein said first ferrodielectric thin film is made from a ferrodielectric material is selected from any one of (Pa, La)—$(ZrTi)O_3$, (Pa, Bi)—$(ZrTi)O_3$, (Pa, La)—$(HfTi)O_3$, (Pa, Ba)—$(ZrTi)O_3$, (Sr, Ca)—$(LiNbTi)O_3$, $LiTaO_3$, $SrTiO_3$, $La_2Ti_2O_7$, $LiNbO_3$, (Pa, La)—$(MgNbZrTi)O_3$, (Pa, Ba)—$(LaNb)O_3$, (Sr, Ba)—$Mb_2O_3$, $K(TaNb)O_3$, (Sr, Ba, La)—$(Nb_2O_6)$, $NaTiO_3$, $MgTiO_3$, $BaTiO_3$, $SrZrO_3$ and $KNbO_3$.

4. The upper dielectric layer according to claim 1, further comprising:

a second ferrodielectric thin film formed on the dielectric thick film.

5. A process of fabricating an upper dielectric layer in a plasma display panel, comprising:

forming an upper dielectric layer on an upper substrate with a pair of sustaining electrodes facing a lower substrate, wherein the forming of the upper dielectric layer comprises:

forming a first ferrodielectric thin film on the upper substrate provided with the pair of sustaining electrodes using a vacuum vapor deposition technique; and forming a dielectric thick film on the first ferrodielectric thin film on the side opposite from the upper substrate using a screen printing technique.

6. The process according to claim 5, further comprising:

forming a second ferrodielectric thin film on the opposite side of the dielectric thick film from the first ferrodielectric thin film using the vacuum vapor deposition technique.

7. A dielectric composition for a lower dielectric layer and a barrier rib in a plasma display panel, comprising:

a parent glass; and a dielectric composition comprising a first filler comprising $TiO_2$ and a second filler containing a phosphorous (P) element.

8. The dielectric composition according to claim 7, wherein said parent glass includes any one of PbO group and non-PbO group glass.

9. The dielectric composition according to claim 7, wherein said second filler includes $BPO_4$ or $Li_3PO_4$.

10. The dielectric composition according to claim 7, wherein said dielectric composition for said lower dielectric layer and said barrier rib comprises: 50 to 80 weight % parent glass; 5 to 20 weight % said first filler; and 5 to 30 weight % said second filler.

11. The upper dielectric layer according to claim 1, wherein the dielectric thick film comprises a low melting point glass.

12. The upper dielectric layer according to claim 11, wherein the low melting point glass comprises alkali atoms or lead atoms to prevent contamination of a protective film.

13. The upper dielectric layer according to claim 1, wherein the plasma display panel further comprises a barrier rib comprising a parent glass and a first filler comprising $TiO_2$.

14. The plasma display panel according to claim 13, wherein the barrier rib further comprises a second filler comprising phosphorus.

15. The plasma display panel according to claim 14, wherein the barrier rib comprises 50–80 weight % parent glass, 5–20 weight % first filler and 5–30% second filler.

16. The process according to claim 5, further comprising forming a lower dielectric layer on a surface of a lower substrate facing the upper substrate, wherein the forming of the lower dielectric layer comprises screen printing a mixture of glass, a $TiO_2$ filler and a phosphorus filler.

17. The process according to claim 6, further comprising forming a protective film on the second ferrodielectric thin film on the opposite side from the dielectric thick film.

18. The dielectric composition according to claim 7, wherein the second filler restrains the rise of the electric constant caused by the first filler.

19. The dielectric composition according to claim 7, wherein the parent glass comprises ZnO.

20. A plasma display panel comprising:

a lower substrate with an address electrode;

an upper substrate with a pair of sustaining electrodes, wherein the pair of sustaining electrodes are parallel to each other and perpendicular to the address electrode, and wherein the upper and lower substrates face each other defining a space therebetween;

a plurality of barrier ribs on the upper electrode substrate facing the lower substrate; and an upper dielectric layer formed on the upper substrate facing the lower substrate, wherein the upper dielectric layer comprises a first dielectric thin film with a high capacitance value and a dielectric constant of more than 1000 formed on the sustaining electrodes and a dielectric thick film formed on the first dielectric thin film.

21. The plasma display panel according to claim 20, wherein said first dielectric thin film comprises (Pa, La)—$(ZrTi)O_3$, (Pa, Bi)—$(ZrTi)O_3$, (Pa, La)—$(HfTi)O_3$, (Pa, Ba)—$(ZrTi)O_3$, (Sr, Ca)—$(LiNbTi)O_3$, $LiTaO_3$, $SrTiO_3$, $La_2Ti_2O_7$, $LiNbO_3$, (Pa, La)—$(MgNbZrTi)O_3$, (Pa, Ba)—$(LaNb)O_3$, (Sr, Ba)—$Mb_2O_3$, $K(TaNb)O_3$, (Sr, Ba, La)—$(Nb_2O_6)$, $NaTiO_3$, $MgTiO_3$, $BaTiO_3$, $SrZrO_3$ or $KNbO_3$.

22. The plasma display panel according to claim 20, wherein the dielectric thick film comprises a low melting point glass, wherein the low melting point glass comprises alkali atoms or lead atoms to prevent contamination of a protective film.

23. The plasma display panel according to claim 20, wherein the upper dielectric layer further comprises a second dielectric thin film formed on the dielectric thick film on the opposite side from the first dielectric thin film.

24. The plasma display panel according to claim 1, further comprising a lower dielectric layer on the lower substrate facing the upper substrate, wherein the lower dielectric layer comprises a parent glass, a first $TiO_2$ filler and a second phosphorus filler.

25. The plasma display panel according to claim 20, wherein the lower substrate and the barrier ribs comprise a parent glass, a first filler comprising $TiO_2$ and a second filler containing phosphorus.

26. The plasma display panel according to claim 25, wherein the second filler comprises $BPO_4$ or $Li_3PO_4$.

* * * * *